United States Patent
Wu et al.

(10) Patent No.: US 10,685,686 B2
(45) Date of Patent: *Jun. 16, 2020

(54) POWER SWITCH CONTROL FOR DUAL POWER SUPPLY

(71) Applicant: Taiwan Semiconductor Manufacturing Co., Ltd., Hsin-Chu (TW)

(72) Inventors: Fu-An Wu, Hsinchu County (TW); Cheng Hung Lee, Hsinchu (TW); Chen-Lin Yang, Hsinchu County (TW); Hung-Jen Liao, Hsin-Chu (TW); Jonathan Tsung-Yung Chang, Hsinchu (TW); Yu-Hao Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/582,029

(22) Filed: Sep. 25, 2019

(65) Prior Publication Data
US 2020/0020363 A1    Jan. 16, 2020

Related U.S. Application Data

(63) Continuation of application No. 16/391,986, filed on Apr. 23, 2019, now Pat. No. 10,510,380, which is a (Continued)

(51) Int. Cl.
*G11C 5/14* (2006.01)
*H03K 17/687* (2006.01)
*H03K 17/22* (2006.01)

(52) U.S. Cl.
CPC ............ *G11C 5/148* (2013.01); *H03K 17/22* (2013.01); *H03K 17/6872* (2013.01)

(58) Field of Classification Search
CPC ..... H03K 17/22; H03K 17/6872; G11C 5/148
See application file for complete search history.

(56) References Cited

U.S. PATENT DOCUMENTS

| 8,098,242 B2 | 1/2012 | Chen |
| 8,427,243 B2 * | 4/2013 | Chen .................... H03C 3/0925 327/156 |

(Continued)

FOREIGN PATENT DOCUMENTS

KR    10-2016-0046155 A    4/2016

OTHER PUBLICATIONS

U.S. Appl. No. 16/391,986, filed Apr. 2019, Wu et al.*
Official Action dated Jun. 19, 2019, in corresponding Korean Patent Application No. 10-2018-0049922.

*Primary Examiner* — Pho M Luu
(74) *Attorney, Agent, or Firm* — Duane Morris LLP

(57) ABSTRACT

An electronic device includes an internal supply rail; a plurality of first main header switches for coupling the internal supply rail to a first power supply; a plurality of second main header switches for coupling the internal supply rail to a second power supply; an auxiliary circuit including a first auxiliary header switch for coupling the internal supply rail to the first power supply and a second auxiliary header switch for coupling the internal supply rail to the second power supply; a feedback circuit, the feedback circuit tracking a status of the first and second main header switches; and a control circuit, the control circuit controlling the first main header switches, second main header switches and first and second auxiliary header switches responsive to the switch control signal and an output of the feedback circuit.

20 Claims, 13 Drawing Sheets

Related U.S. Application Data continuation of application No. 15/902,118, filed on Feb. 22, 2018, now Pat. No. 10,304,500.

(60) Provisional application No. 62/526,777, filed on Jun. 29, 2017.

(56) References Cited

U.S. PATENT DOCUMENTS

| | | |
|---|---|---|
| 8,836,166 B2 | 9/2014 | Maher |
| 9,252,750 B2 | 2/2016 | Umeyama |
| 9,742,295 B2 * | 8/2017 | Chen ................ H02M 3/33523 |
| 10,269,425 B2 * | 4/2019 | Gokmen ................ G06N 3/02 |
| 10,304,500 B2 * | 5/2019 | Wu .................... H03K 17/6872 |
| 2003/0042795 A1 | 3/2003 | Veendrick |
| 2016/0111134 A1 | 4/2016 | Kim et al. |
| 2019/0005990 A1 | 1/2019 | Wu |

\* cited by examiner

… (US 10,685,686 B2)

POWER SWITCH CONTROL FOR DUAL POWER SUPPLY

CROSS REFERENCE TO RELATED APPLICATION

This application is a continuation application of and claims priority to U.S. patent application Ser. No. 16/391,986, filed Apr. 23, 2019, now U.S. Pat. No. 10,510,380, which is a continuation application of U.S. patent application Ser. No. 15/902,118 filed Feb. 22, 2018, now U.S. Pat. No. 10,304,500, and claims priority to U.S. Provisional Patent Application No. 62/526,777 filed Jun. 29, 2017, the entirety of each of which is hereby incorporated by reference herein.

BACKGROUND

Modern electronic devices, such as computers, servers, and smart phones can have internal systems, for example memories, that can operate from multiple external (vis a vis the internal system) voltages and also from an internal voltage supply. Problems can arise if the switching procedures for switching between the external power supplies are not carefully controlled. For example, header switches can be stressed if the power supplies are allowed to short together for a period of time, particularly after numerous switching cycles. In turn, this can lead to reliability problems and device failure.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1A:
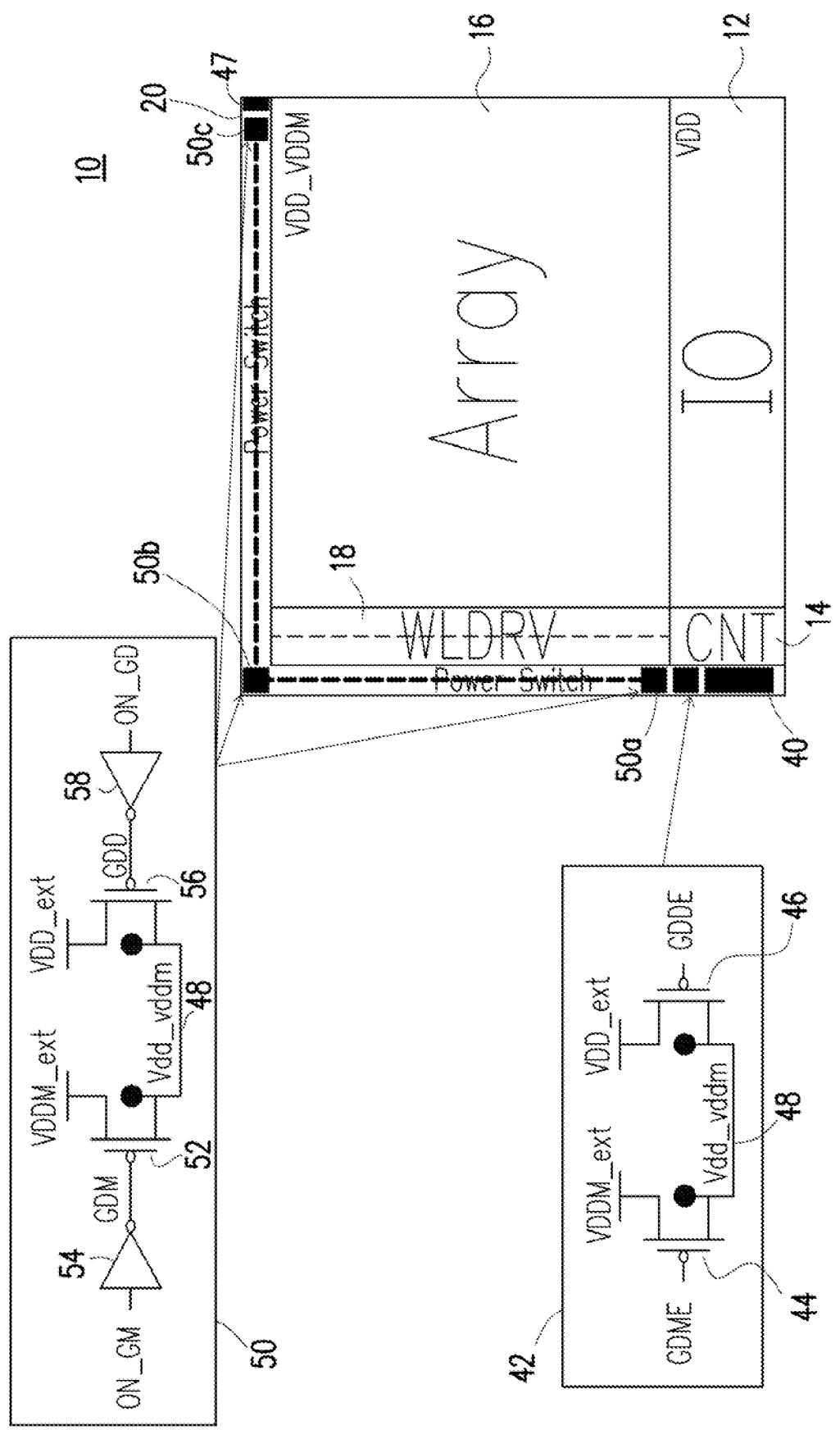
FIG. 1A illustrates a memory device having main and auxiliary power switches, according to certain embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In certain embodiments described herein, a power switching scheme is implemented for controlling switching between power supplies. In embodiments, the switched power supplies are different and the switching process is controlled so that there are no shorts between the power supplies. In embodiments, the power supplies are the same or substantially the same, and the switching process is controlled such that there is operational power (e.g., for memory accesses) during switching between power supplies. In embodiments, connections to the power supplies are also controlled such that shorts between the power supplies do not occur during powering on/off of the electronic device.

Electronic devices can have a portion powered selectively by two different external power supplies. A memory device, such as but not limited to a static random access memory (SRAM) device, is an example of such an electronic device. The memory device includes an IO portion and a control portion that operates with an internal supply VDD. The memory array operates selectively either from one of two external power supplies, specifically VDD_ext (which corresponds to the internal supply VDD) or VDDM_ext. The power domain of the memory array, therefore, may be referred to herein as "VDD_VDDM". The device includes a word line driver portion that provides driving signals and can be considered as operating in both the internal power domain VDD and the external power domain VDD_VDDM. A power switch is provided along the periphery of the array for switching between the external domains VDD_ext and VDDM_ext.

An electronic device, such as described above, includes a power switch portion for switching an internal supply rail between external power supplies (VDD_ext or VDDM_ext). The internal supply rail is referred to herein as the VDD_VDDM rail, as it is connected to either VDD_ext or VDDM_ext. A switch control signal (PSwitch) is received at a level shifter, which level shifts the switch control signal from the low internal VDD domain to the higher domain ($V_{MAX}$) needed to drive the PMOS header switches. The voltage $V_{MAX}$ is supplied at a rail that is tied to the higher of voltages VDD_ext and VDDM_ext through a pair of circuits. For example, a first circuit can includes a pair of PMOS transmitters tied between VDD_ext and VDDM_ext and the $V_{MAX}$ rail, with the gate terminals of the PMOS transistors tied to the $V_{MAX}$ rail. A second circuit can include a second pair of PMOS transmitters tied between VDD_ext and VDDM_ext and the $V_{MAX}$ rail, with the gate terminals of the PMOS transistors cross-coupled to VDDM_ext and VDD_ext, respectively. The VDD_VDDM rail is connected to a first external voltage supply (VDD_ext) through a PMOS header switch and is connected to a second external voltage supply (VDDM_ext) through another PMOS header switch. The path from the level shifter to the VDDM_ext PMOS header switch is longer than the path from level shifter to the VDD_ext PMOS header switch and includes a delay through at least one inverter. The difference in control timing between the VDDM_ext and VDD_ext PMOS header switches can result in a short between the external power supply VDDM_ext and the external power supply VDD_ext through the VDD_VDDM rail. This abnormal current flows through the PMOS header switches and stresses the PMOS header switches, which can lead to reliability problems after a number of cycles.

Specifically, the delay in timing between the power switch control signal reaching the VDD_ext header (the "short path") and reaching the VDDM_ext header (the "long path") results in a brief time where both the short path and long path control signals are low, meaning both headers switches are on. As such, a short exists between the two external power supplies VDD_ext and VDDM_ext, thereby stressing both header switches.

FIG. 1A illustrates a memory device 10 according to certain embodiments. The memory device 10 includes a power switch portion 20. The power switch portion 20 of the memory device 10 includes a power switch control circuit 40 that is, in certain embodiments, included in the control region 14 and that is not illustrated in detail in FIG. 1A but will be described in detail below. The power switch portion 20 also includes an auxiliary power switch 42 in the main control region 14. This auxiliary power switch 42 includes a first header switch 44 connected between the internal supply rail 48 (labeled VDD_VDDM) and the external power supply VDDM_ext. The first header switch 44 is responsive to control signal GDME, which will be described in detail below. The auxiliary power switch 42 also includes a second header switch 46 connected between the internal supply rail 48 and the external power supply VDD_ext. The second header switch 46 is responsive to control signal GDDE, which will be described in detail below. Whereas, in embodiments, the auxiliary power switch 42 is only included in the main control region 14, the main power switch 50 is distributed over the memory array 16, the I/O 12 and the word line driver 18 as discussed below. This distribution leads to a several gate delay difference between instances of the main power switch 50 from a timing control view.

As noted, memory device 10 includes a main power switch 50 that is distributed across the full memory macro. For example, the instances of the main power switch 50 are included along the entire periphery of memory array and include, for example, a first instance 50a, and intermediate instances 50b and a last instance 50c as well as instances between 50a and 50b and instances between 50b and 50c. Each instance of the main power switch 50 includes a first header switch 52 connected between the internal supply rail 48 (again labeled VDD_VDDM) and the external power supply VDDM_ext. The first header switch 52 is responsive to control signal GDM, which is provided from an inverter 54 from signal ON_GM. Signal ON_GM is used to select VDDM_ext and will be described in detail below. The main power switch 50 also includes a second header switch 56 connected between the internal supply rail 48 and the external power supply VDD_ext. The second header switch 56 is responsive to control signal GDD, which is provided from an inverter 58 from signal ON_GD. Signal ON_GD is used to select VDD_ext and will be described in detail below.

Memory device 10 also includes feedback control logic 47 that is not illustrated in detail in FIG. 1A but will be described in detail below. In embodiments, the feedback control logic 47 is located at a position located most distal from the power switch control circuit 40. By "most distal," it is meant that it is located proximate to the last of the main power switches to receive the power switch control signals ON_GM and ON_GD provided by the power switch control circuit 40.

Figure 1B:
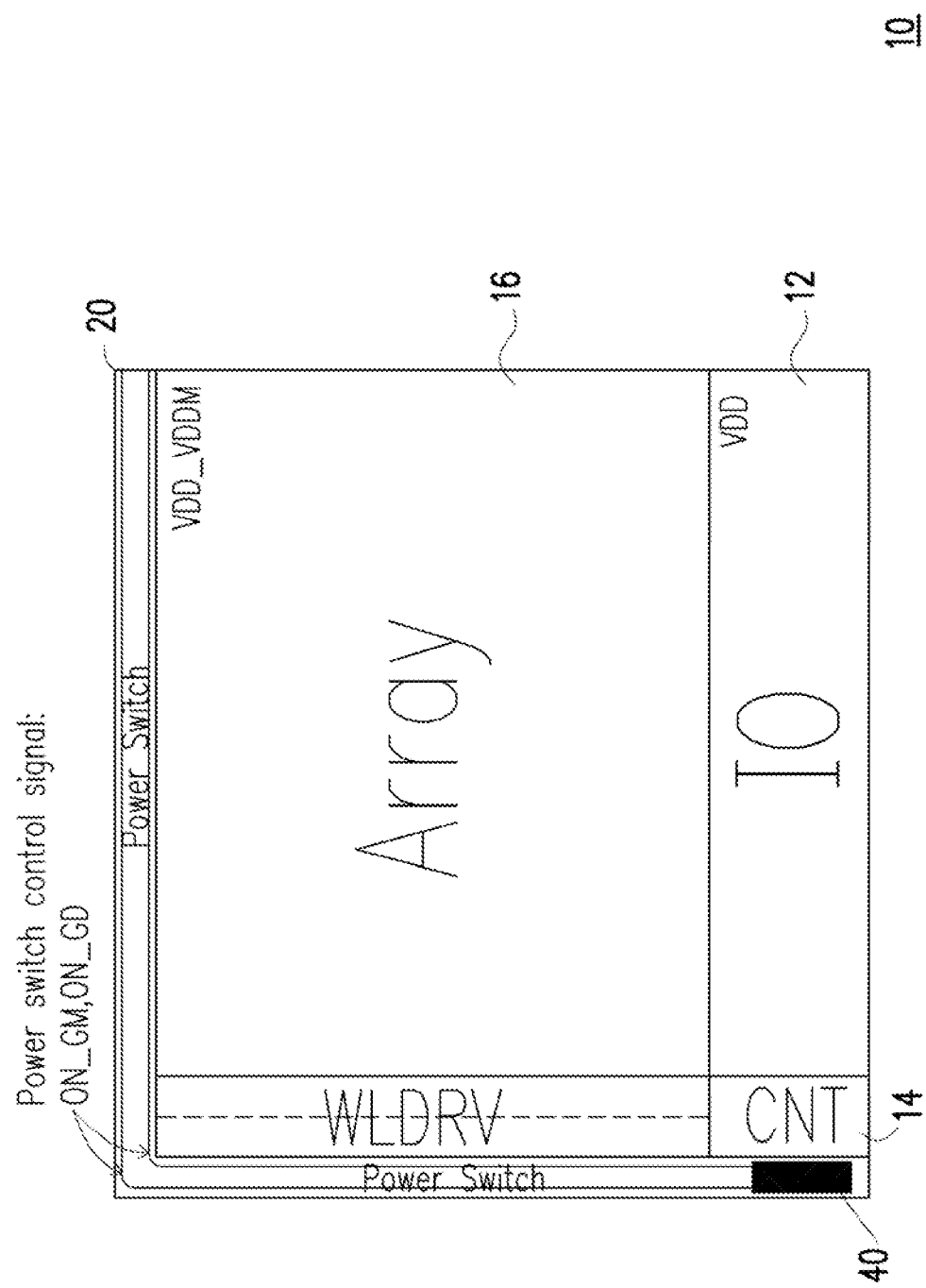
FIG. 1B illustrates the path of power switch control signals in the memory device of FIG. 1A, according to certain embodiments.

FIG. 1B illustrates the memory device 10 and shows the power switch control signals ON_GM and ON_GD originating from the power switch control circuit 40. The switch control signals ON_GM and ON_GD are provided to each instances of the main power switch 50, with the instance most proximate to the switch control circuit 40 (i.e., instances 50a in FIG. 1A) receiving the switch control signals ON_GM and ON_GD before the more distal instances of the main power switch (i.e., instances 50b and 50c in FIG. 1A).

Figure 2:
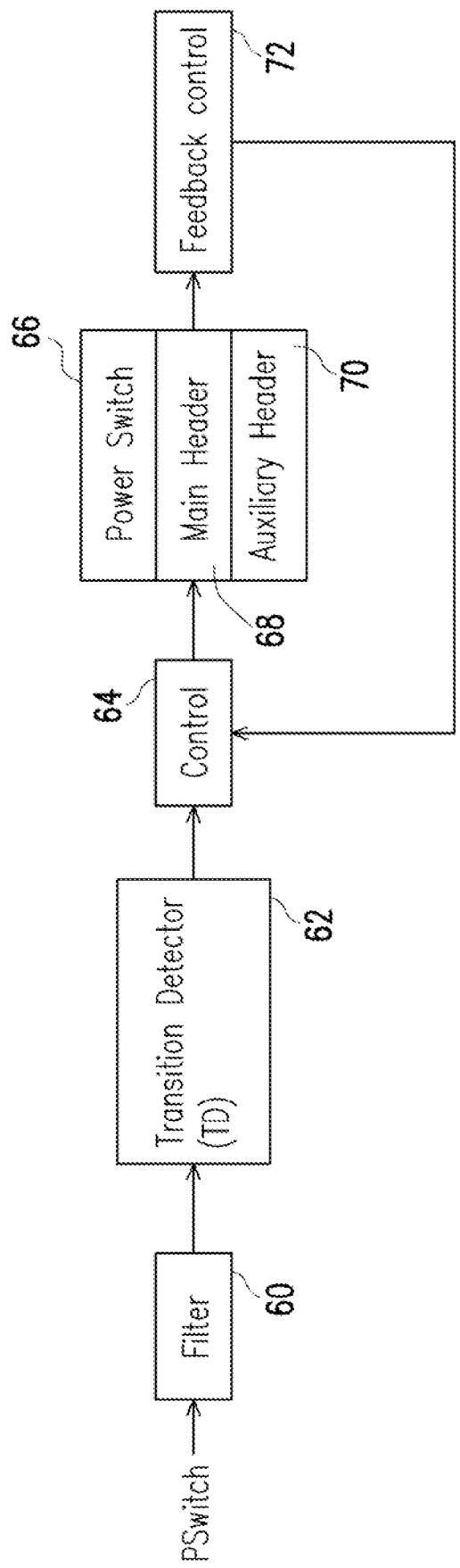
FIG. 2 is a block diagram illustrating various components of a power switch control architecture, according to certain embodiments.

FIG. 2 is a block diagram illustrating various components of a power switch control architecture, according to certain embodiments. Embodiments of a power switch control sequence using the components of FIG. 2 are described below in connection with FIGS. 3-5. As shown in FIG. 2, the power switch control architecture is responsive to a switch control signal PSwitch. The PSwitch control signal, in embodiments, is filtered by an optional filter 60 to provide an effective power switch control signal as described in more detail below in connection with FIG. 3. The effective switch control signal is provided to a transition detector 62 that detects transitions in the logic level of the effective switch control signal. The control logic 64 is responsive to these switches as detected by the transition detector. The control logic 64 controls the power switches, including in embodiments the main header switches 68 and an auxiliary header switch 70, which is described in more detail below. Feedback control logic 72 is provided and provides feedback signals to the control logic for controlling the power switch 66.

Figure 3:
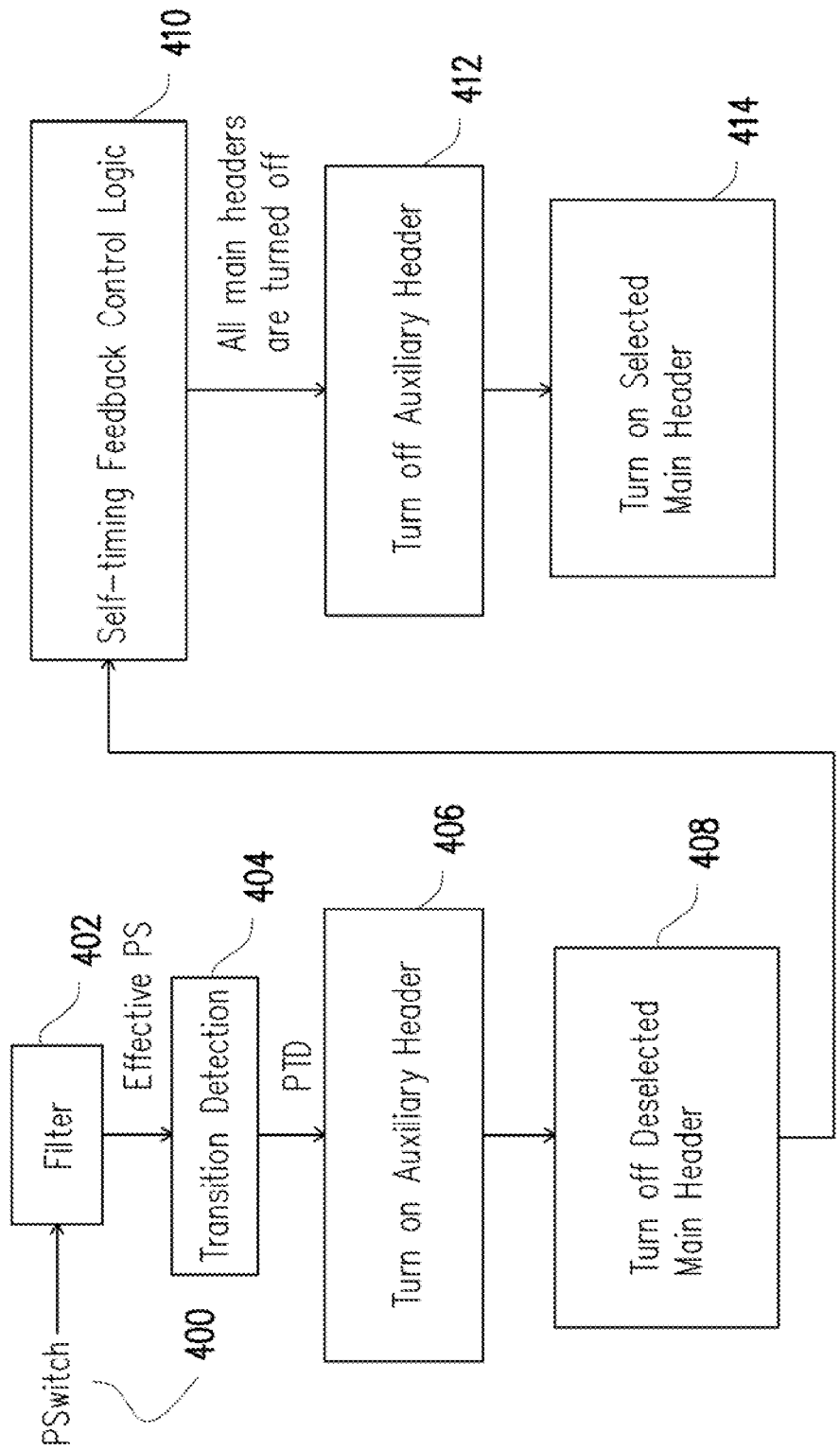
FIG. 3 illustrates a power switch control method in a non-overlap power supply environment, according to certain embodiments.
Figure 10:
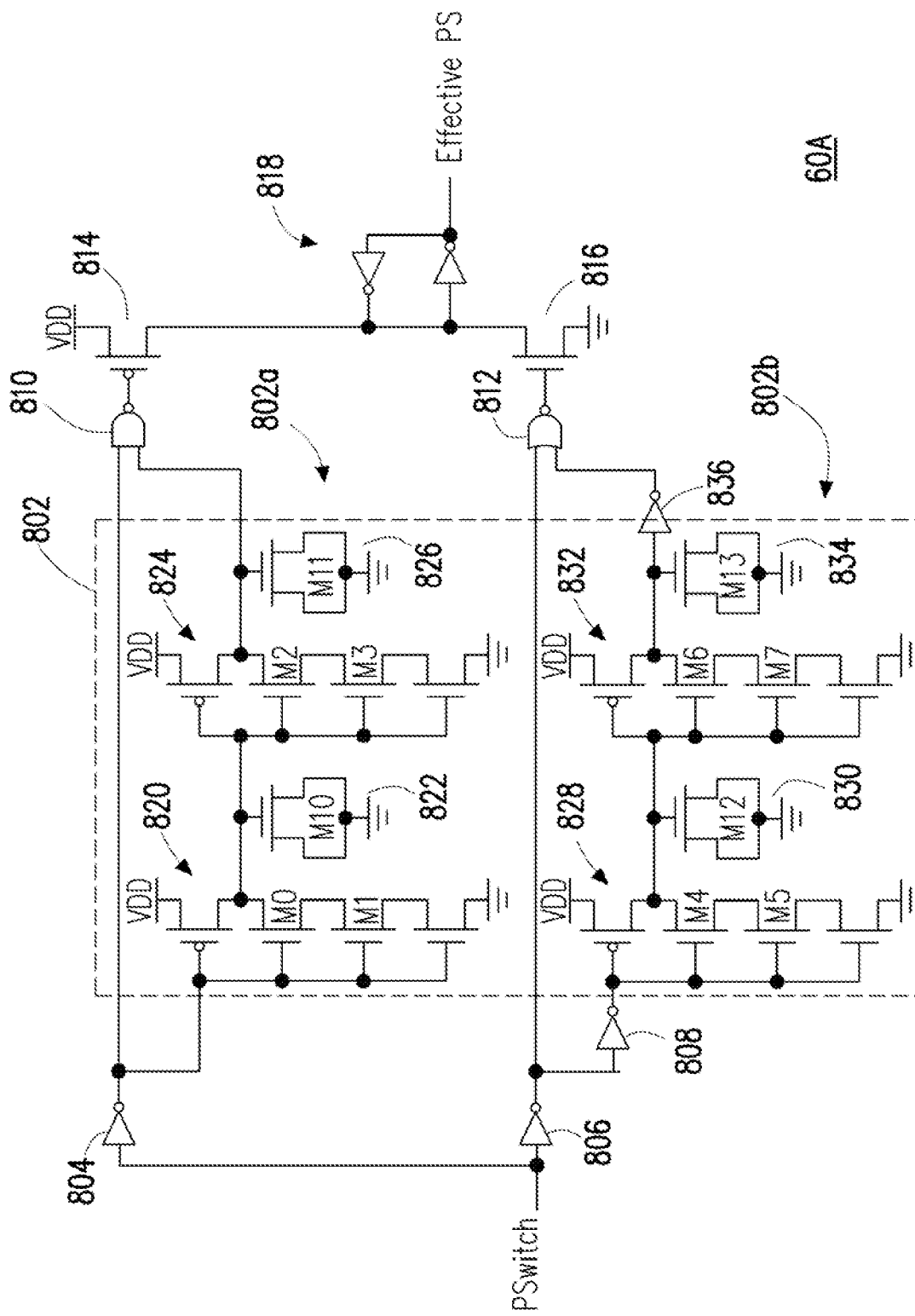
FIG. 10 illustrates an example of a filter according to certain embodiments.

FIG. 3 illustrates a power switch control sequence in a non-overlapping external power domain scenario, according to certain embodiments. By "non-overlapping," it is meant that VDD_ext is greater than VDDM_ext or VDDM_ext is greater than VDD_ext and the VDDM_ext and VDD_ext header switches are not triggered simultaneously, such as is described above due to different delays in the paths to the header switches. At step 400, a switch control signal (PSwitch) is provided to the control circuit of the main power switch and the auxiliary power switch. In embodiments, if PSwitch is a logical 1, then the power domain VDD_ext is being selected; and if PSwitch is a logical 0, then the power domain VDDM_ext is selected. In embodiments, at step 402, the switch control signal PSwitch is filtered to provide an effective power switch control signal. An embodiment of a filter that can be used is illustrated in FIG. 10. At the chip level, there is noise that can induce glitches on the PSwitch signal. A filter can be used to remove the noise to provide the effective power switch control signal. At step 404, a transition detector ("TD") detects if there is a transition in PSwitch, i.e., a change in its logical state. A signal PTD indicates that there has been a PSwitch transition detect. At step 406, upon a detection in a transition in the logical state of the PSwitch control signal, the auxiliary header (FIG. 1A) that corresponds to the currently on main header (which is now deselected) is turned on. The purpose of turning on the auxiliary header when PTD is high is to maintain the internal power level when the deselected main headers are being turned off. As an example, assume that VDD_ext header is currently on and the VDDM_ext header is currently off. Then VDD_ext is deselected, meaning VDDM_ext is selected for use. Upon a power switch transition detection that indicates this change, at step 406 the VDD_ext auxiliary header is turned on to maintain the internal power level at VDD_ext while the VDD_ext main header switches are being turned off. Turning on the auxiliary header switches in the main control portion of the memory device is used to support potential leakage. That is, operation during power switching is not permitted but there is intrinsic leakage from the devices (PMOS/NMOS) in, for example, an SRAM macro 10. The number of "on" header switches should be large enough to supply leakage from devices during power switching, otherwise the content stored in the SRAM cell may be destroyed. At step 408, the deselected main header switches are turned off, sequentially as the control signal reaches the instances of the main power switches. In this example, the VDD_ext main header switches are being turned off. Since it takes some time for all of the deselected main header switches to be turned off, the deselected auxiliary header switch (which was turned on at step 406) is left on while the corresponding main header switches are turned off. The turned-on corresponding deselected auxiliary header switch will be turned off after all of the deselected main header switches are turned off. At step 410, the self-timing control logic introduced above in connection with FIG. 1A is used to indicate when all of the deselected main headers are turned off. In this example, deselected power supply is VDD_ext. As such, when all of the VDD_ext main header switches are turned off (via step 408), the flag (e.g., HD_OFFB shown in FIGS. 6A and 6C (described below) is logical high) of the self-timing control logic is set, meaning it is now fine to (i) turn off the corresponding deselected auxiliary header (step 412), which was responsible maintaining the power level on the internal supply line, and (ii) then turn on the selected main header (414). In this manner, in certain embodiments, the selected main header switch (VDDM_ext header switch in the example) is turned on only after it is known that all of the deselected main header switches (VDD_ext header switches) are turned off. This methodology prevents any the VDD_ext main header switches and VDDM_ext main header switches from being on simultaneously and thus prevents unwanted shorts between the VDD_ext power supply and the VDDM_ext power supply. This approach prevents undue stressing of the header switches.

Figure 4:
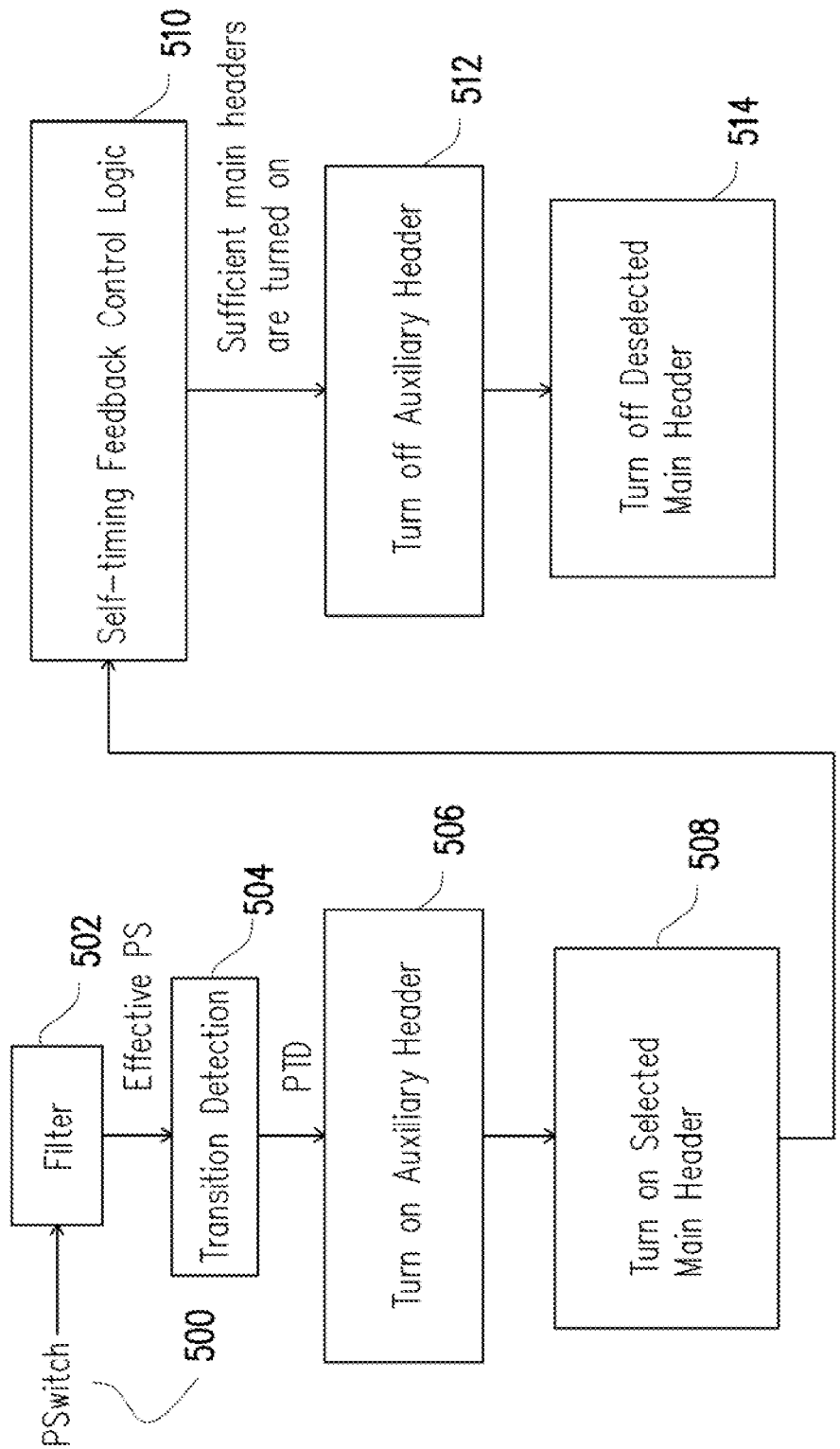
FIG. 4 illustrates a power switch control method in an overlap power supply environment, according to certain embodiments.

FIG. 4 illustrates a power switch control sequence in a no-floating power domain scenario, according to certain embodiments. By "no-floating," it is meant that VDD_ext is the same as VDDM_ext or that these two power supplies are sufficiently the same such that it is acceptable for there to be a short between the two power supplies when switching from one to the other. In certain embodiments, the reason VDD_ext and VDDM_ext may be the same or substantially the same is that the device has the ability to separate the internal supply rail into multiple rails that will be separated after switching. In certain embodiments, a methodology is used such that a sufficient number of headers are on during the switch between power supplies to supply enough internal power to the memory macro to allow for access operations without degrading performance. For purpose of illustration, assume that VDD_ext main header switches are currently on and VDDM_ext main header switches are currently off, and a switch control signal is issued to deselect the VDD_ext main header switches and select the VDDM_ext main header switches. Steps 500 to 506 are the same as steps 400 to 406 described above in connection with the method of FIG. 3. To be sure, using our example, at step 506, the VDD_ext auxiliary header switches are turned on. Turning on the auxiliary header switches in the main control portion of the memory device provides all of the power for consumption of the main control circuits because the distributed main power switches cannot provide sufficient supply to the main control circuit. This may be the case in an IDR (Interface Dual Rail) configuration where all input control signals are connected to level shifters that shift from the VDD domain to the VDDM domain rather than the $V_{MAX}$ domain. As such, almost all of the macro 10 is in the VDDM power domain rather than the $V_{MAX}$ domain in that instance. The method of FIGS. 3 and 4 deviate at step 508. At step 508 the selected main header switches are turned on, meaning the VDDM_ext main header switches are turned on. At this time, there will be both VDD_ext and VDDM_ext main header switches that are on. At step 510, self-timing control logic is used detect that sufficient main header switches (here VDDM_ext header switches) are turned on, which indicates that it is then appropriate to turn off deselected auxiliary header switch turned on in step 506. In embodiments, the feedback point could be at the last main power switch, such as show in FIG. 1A and as used with the methodology of FIG. 3, which would be the most conservative approach. In other embodiments, the feedback point could be at or around the middle of the instances of the main power switches, for example at instance 50*b* in FIG. 1A or at any point between instance 50*b* and instance 50*c*, which would be a more aggressive approach. In other embodiments, the timing delay need not be triggered of the control signals propagating to instances of main power switches but rather can be triggered off of any internal delay or trigger point that ensures the desired result, i.e., sufficient operating power on the internal supply rail to allow for access operations. At step 512, upon detection that sufficient selected main header switches are turned on, then the deselected auxiliary header is turned off. Finally, at step 514, the deselected main header switches (for example, VDD_ext main header switches) are turned off. In embodiments, the primary benefit of the method of FIG. 4 is that the memory macro can still do read and write operations during power rail switching, which is not a possibility in the non-overlap scenario of the method of FIG. 3.

Figure 5:
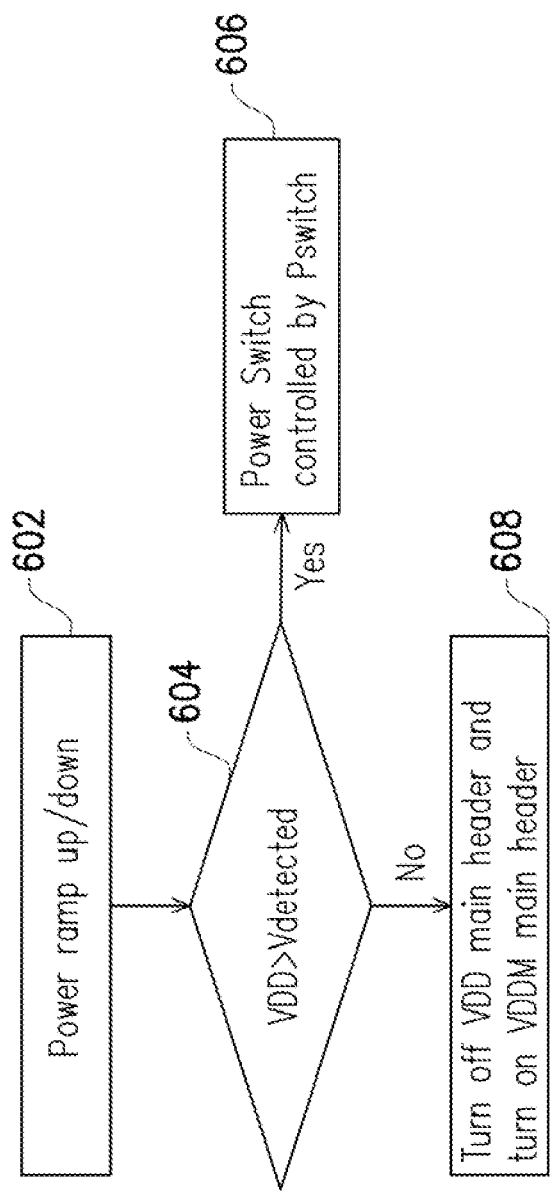
FIG. 5 illustrates a power switch control method for protecting against shorts between power supplies during power up/down, according to certain embodiments.

FIG. 5 illustrates a power control methodology that can be employed, in certain embodiments, during powering on/off of the electronic device, such as a memory device. In embodiments, the methodology is adapted to prevent power shorts during powering the device on/off in the non-overlap scenario. As explained above, in the non-overlap scenario, VDD_ext is greater than VDDM_ext or vice versa. Both of these external power supplies VDD_ext and VDDM_ext will ramp up from ground or discharge to ground and it is desirable to prevent shorts between the supplies during this time.

At step 602 the power ramp up/down begins, for example ramp up/down of VDD_ext. At step 604, the method monitors when VDD_ext is greater than a reference voltage Vdetected. In certain embodiments, Vdetected is at or around 2*Vt, i.e., two times the threshold voltage of a NMOS/PMOS transistor. The assumption is that the external power rail is ready when VDD_ext is larger than this threshold voltage as VDDM_ext should be ready before VDD_ext in the general case. In embodiments, the power supply of the power detector is VDDM (i.e., from VDDM_ext) and VDD (i.e., from VDD_ext) is the detected power rail. Upon detection that VDD is greater than the reference or threshold voltage Vdetected, then at step 606 the main power switch is controlled by signal PSwitch. In embodiments, it is controlled by signal PSwitch in the manner described above in connection with FIG. 3. When VDD_ext is not greater than Vdetected, at step 608, the VDD_ext main header switches are turned off and the VDDM_ext main header switches are turned on. This is done since VDDM_ext should be ready first. This methodology prevents shorts between the VDD_ext and VDDM_ext supplies on both power up and power down as follows. During power up, initially both VDD_ext and VDDM_ext are below Vdetected and the VDDM_ext main header switches are on and all VDD_ext main header switches are off (per step 608), which means that there is no possible short therebetween. VDDM_ext then passes Vdetected but all VDD_ext header switches remain off and all VDDM_ext switches remain on. Once VDD_ext passes Vdetected, the methodology of FIG. 3 takes over (per step 606), which prevents shorts between the VDD_ext and VDDM_ext supplies. During power down, both VDD_ext and VDDM_ext are initially above Vdetected. During this time, the methodology of FIG. 3 controls and ensures that there are no shorts because VDD_ext and VDDM_ext header switches will not be on simultaneously. When VDD_ext eventually drops below Vdetected, the VDDM_ext header switches are turned on and VDD_ext header switches are turned off (step 608).

Figure 6A:
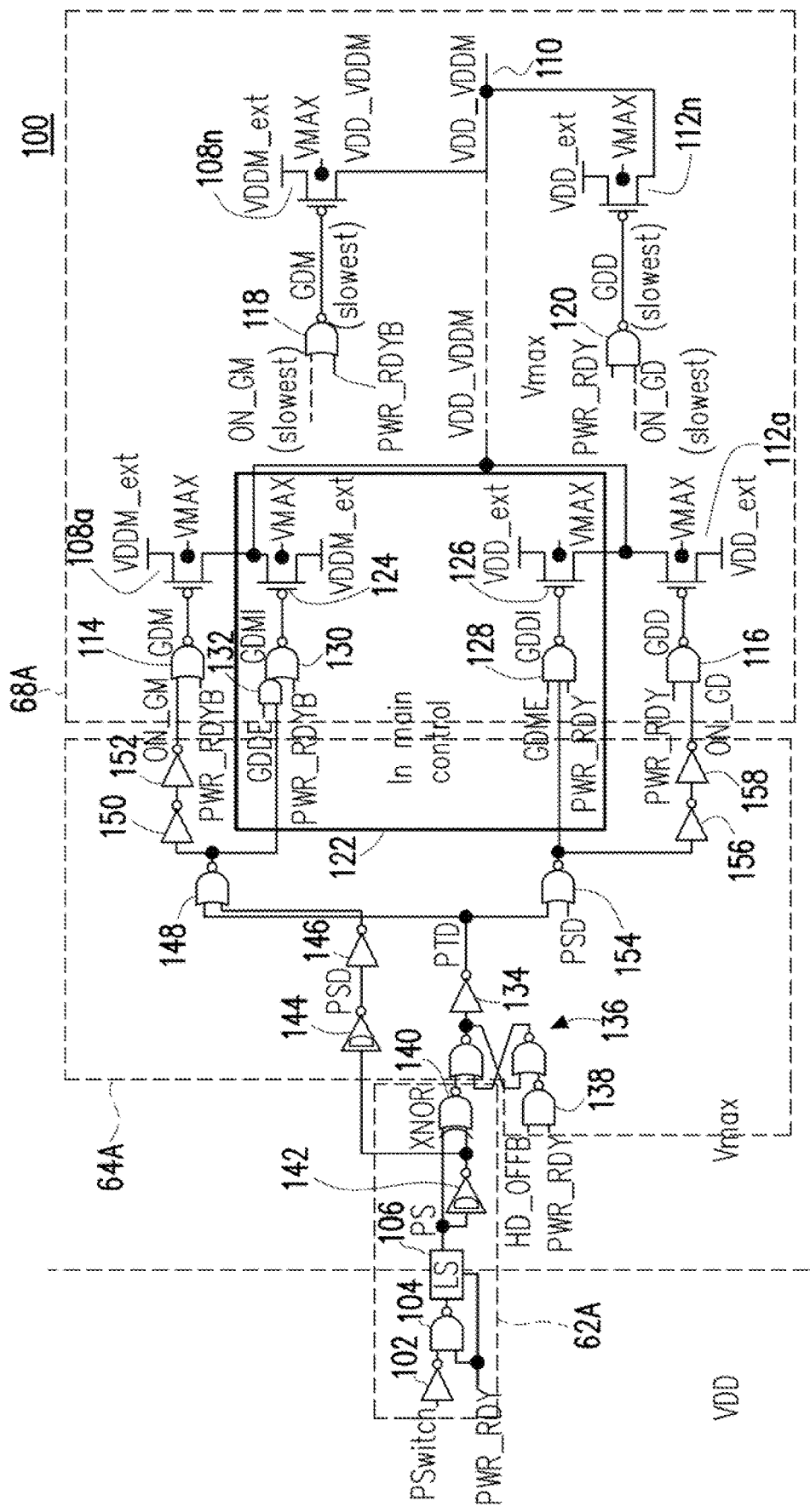
FIGS. 6A to 6D illustrate a power switch control circuit for use in a non-overlap power supply environment, according to certain embodiments.
Figure 6D:
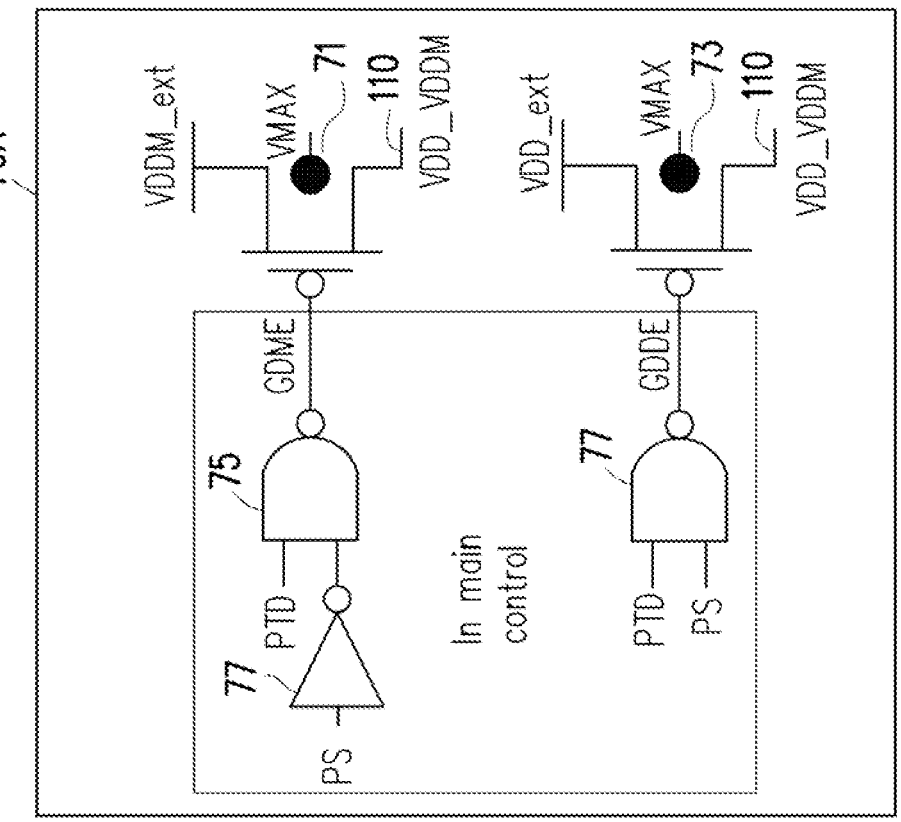
Figure 6B:
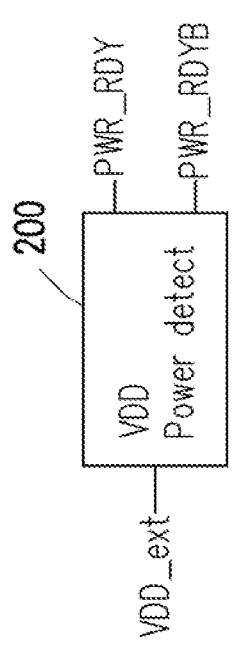
Figure 6C:
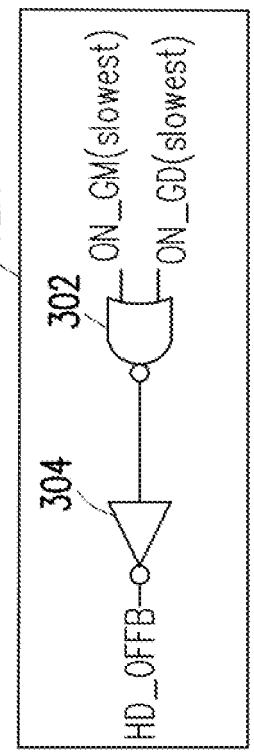
Figure 7:
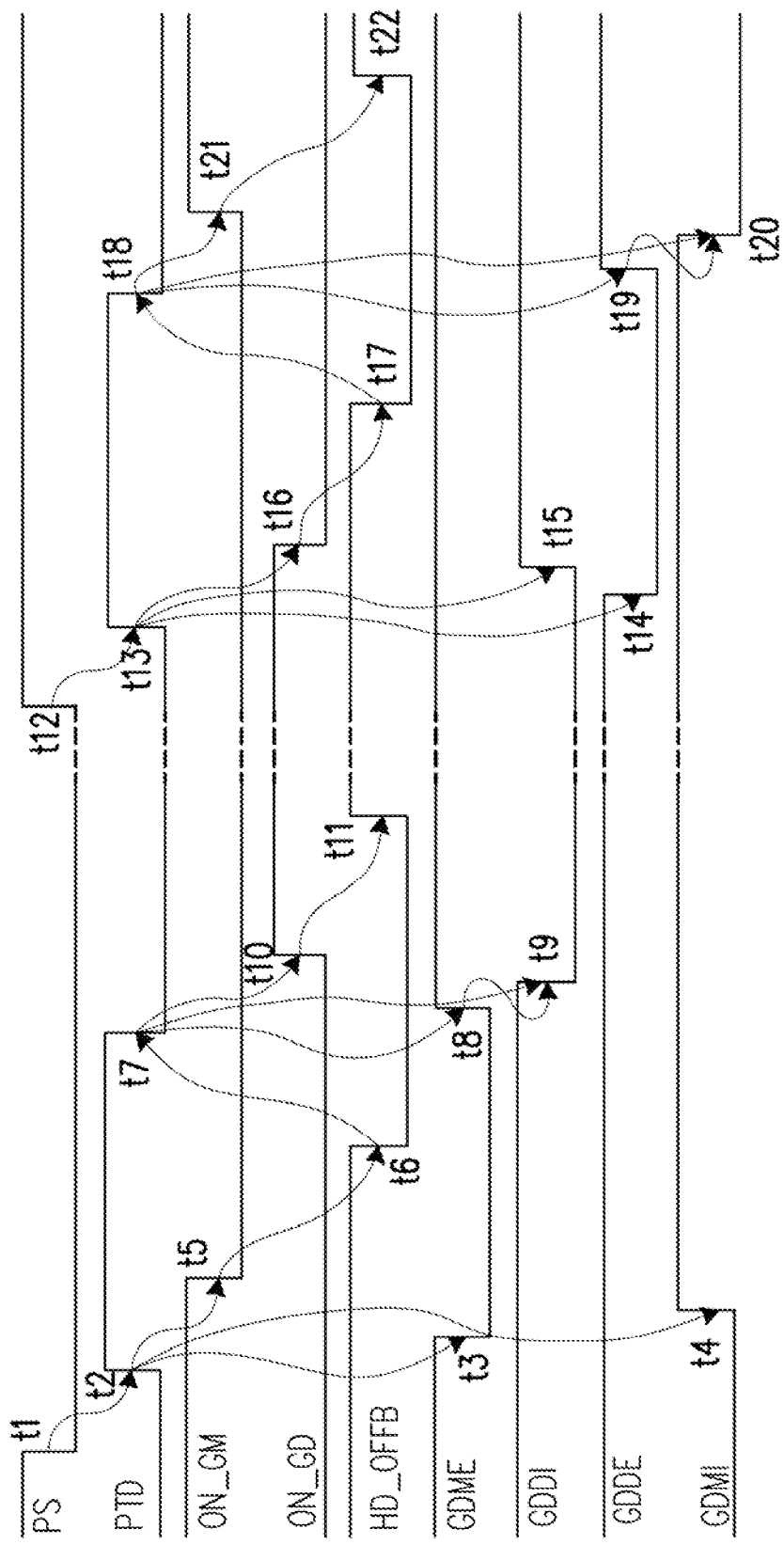
FIG. 7 illustrates a signal timing diagram for the power switch control circuit of FIGS. 6A to 6D, according to certain embodiments.

In certain embodiments, the power switch control sequences of FIGS. 3 and 5 are implemented in the circuits of FIG. 6A, FIG. 6B, FIG. 6C and FIG. 6D. FIG. 7 shows a signal timing diagram illustrating the operation of the circuits of FIGS. 6A to 6D. In FIG. 6A, dashed block 62A illustrates components that correspond to an embodiment of the transition detector 62 of the block diagram of FIG. 2. Dashed block 64A illustrates components that correspond to an embodiment of the control 64 of the block diagram of FIG. 2. In embodiments, the optional power detector of FIG. 6B can be part of the control 64. Dashed block 68A illustrates components that correspond to an embodiment of the main header 68 of the power switch 66 of the block diagram of FIG. 2. An embodiment 70A of the auxiliary header 70 of the power switch 66 is shown in FIG. 6D.

FIG. 6A shows a power switch control circuit 100. Devices to the left of the dashed line are in the internal VDD domain and are used to generate signal PS from signal PSwitch and signal PWR_RDY. Signal PWR_RDY and its inverse PWR_RDYB are provided by a power detector 200 (FIG. 6B) which detects when VDD_ext exceeds the reference voltage (e.g., 2*Vt as explained above in connection with FIG. 5). In one embodiment, the power detector 200 is a voltage level detector, for example a circuit including a half set of Schmitt trigger circuits. In the illustrated embodiment, PWR_RDY is logical high when VDD_ext is higher than the Vdetected threshold and logical low when VDD_ext is below the Vdetected threshold. In FIG. 6A, PSwitch is provided to an inverter 102. The output of the inverter 102 (i.e., inverted PSwitch) is provided along with signal PWR_RDY to NAND gate 104. The output of the NAND gate 104 is level shifted from the VDD domain to the Vmax domain by level shifter 106. The circuit 100 operates such that signal PS is logical high (1) when PWR_RDY is logical low (0) (i.e., whenever VDD_ext is less than 2*Vt), and PS will follow signal PSwitch when PWR_RDY is logical high. FIG. 6A illustrates a first main VDDM_ext header switch, i.e., PMOS 108a, connected between VDDM_ext and the VDD_VDDM supply rail 110 and a last VDDM_ext header switch, i.e., PMOS 108n, also connected between VDDM_ext and VDD_VDDM supply rail 110. As explained above in connection with FIG. 1A, a plurality of other main VDDM_ext header switches are connected in the same manner between the first and last VDDM_ext header switches 108a, 108n, respectively. A first main VDD_ext header switch, i.e., PMOS 112a, is connected between VDD_ext and the VDD_VDDM supply rail 110 and a last VDD_ext header switch, i.e., PMOS 112n, is connected between VDD_ext and the VDD_VDDM supply rail 110. As explained above in connection with FIG. 1A, a plurality of other main VDD_ext header switches are connected in the same manner between the first and last VDD_ext header switches 112a, 112n.

Signal GDM is coupled to the gate terminals of the PMOS 108a to 108n of the VDDM_ext main header switches. Of course, the slowest path for signal GDM is the path to VDDM_ext header switch 108n. Signal GDM is provided from a NOR gate 114 whose inputs are ON_GM and PWR_RDYB. GDM is logical low whenever PWR_RDYB is logical high (i.e., whenever PWR_RDY is logical low), meaning whenever VDD_ext is less than Vdetector. This configuration implements step 608 of FIG. 5 because header switches 108 are on when GDM is logical low, which connects VDD_VDDM rail 110 to VDDM_ext. When PWR_RDYB is logical low, GDM is simply the inverse of ON_GDM.

Conversely, VDD_ext header switches 112 are controlled by signal GDD. Signal GDD is provided by the output of NAND gate 116, which has as inputs ON_GD and PWR_RDY. PWR_RDY is logical low when PWR_RDYB is logical high. When PWR_RDY is logical low, the output of NAND 116 is logical high (i.e., GDD). This condition turns off VDD_ext header switches 112. When PWR_RDY is logical high, GDD is the inverse of ON_GO.

As shown in FIG. 6A, the last VDDM_ext header switch 108n is controlled by GDM (slowest) provided from NOR gate 118, which receives as inputs ON_GM (slowest) and PWR_RDYB. The last VDD_ext header switch 112n is controlled by GDD (slowest) provided from NAND gate 120, which receives as inputs ON_GD (slowest) and PWR_RDY. FIG. 6C shows self-timing or feedback circuit 72A that is responsive to ON_GM (slowest) and ON_GD (slowest). This circuit 72A corresponds to an embodiment of the feedback control 72 in the block diagram of FIG. 2. The self-timing circuit 72A includes NOR gate 302 and inverter 304 and provides at its output signal HD_OFFB. The self-timing circuit operates such that HD_OFFB is logical high (1) whenever at least one of ON_GM (slowest) and ON_GD (slowest) is a logical 1, meaning one of GDM (slowest) and GDD (slowest) is logical zero. When at least one of ON_GM (slowest) and ON_GD (slowest) is a logical high, the output of the NOR gate 302 is logical low and the output of inverter 304 is logical high. When both ON_GM slowest and ON_GD (slowest) are logical low, meaning both GDM (slowest) and GDD (slowest) are logical high and the last VDDM_ext and VDD_ext header switches 108n, 112n, respectively, are both off, then HD_OFFB is logical low (0).

An embodiment of the auxiliary header circuit 70 illustrated in the block diagram of FIG. 2 is shown in FIG. 6D. The auxiliary header circuit 70A of FIG. 6D includes an auxiliary VDDM_ext header switch in the form of PMOS 71 connected between VDDM_ext and the VDD_VDDM rail 110 and an auxiliary VDD_ext header switch in the form of PMOS 73 connected between VDD_ext and VDD_VDDM rail 110. PMOS 71 is controlled by signal GDME at its gate. Signal GDME is provided from NAND gate 75, which has as its inputs signal PTD and PS bar (i.e., the inversion of PS by inverter 77). PMOS 73 is controlled by signal GDDE at its gate. Signal GDDE is provided from NAND gate 77, which has as its inputs PTD and PS. In operation, signal GDME is logical low, meaning the VDDM_ext auxiliary header is on and connects VDDM_ext to the VDD_VDDM rail 110, whenever both PTD is logical high and PS bar is logical high. That is, the VDDM_ext auxiliary header switch 71 is on when a transition is detected in signal PS, which is represented by PTD high, and PS is logical low, which means that VDDM_ext is deselected. Conversely, signal GDDE is logical low, meaning the VDD_ext auxiliary header is on and connects VDD_ext to the VDD_VDDM rail 110, whenever both PTD is logical high and PS is logical high. That is, VDD_ext auxiliary header switch 73 is on when a transition is detected in signal PS (i.e., PTD high) and PS is logical high, which means that VDD_ext is deselected.

The block 122 of FIG. 6A is labeled "In main control" and is located in the control portion 14 of FIG. 1A. Block 122 is used to minimize the non-overlay period to one gate delay. Block 122 includes a PMOS VDDM_ext header switch 124 connected between VDDM_ext and the VDD_VDDM rail 110, and a PMOS VDD_ext header switch 126 connected between VDD_ext and the VDD_VDDM rail 110. The switch 124 is controlled by signal GDMI, which is provided from NOR gate 130. NOR gate 130 receives as an input PWR_RDYB and the output of AND gate 132. AND gate 132 receives as inputs signal GDDE and a delayed version of switch control signal PS. The switch 126 is controlled by signal GDDI, which is provided from NAND gate 128. NAND gate 128 receives as inputs signals PWR_RDY, GDME and a delayed version of switch control signal PS. Header switches 124 and 126 are triggered a few gate delays sooner than their corresponding main header switches 108a, 112a.

The power switch control circuit 100 includes logic for generating the transition detect signal PTD, which indicates that there has been a transition in the logic level of PSwitch (or PS). This logic includes inverter 134, which provides signal PTD, latch 136 (which in certain embodiments is an R-S latch), which includes a pair of cross-coupled NOR gates, NAND gate 138 that feeds a first input to the latch 136 and exclusive NOR (XNOR) gate 140. XNOR 140 has as inputs switch control signal PS and a delayed and inverted version of PS provided by the delay inverter 142. NAND gate 138 has as inputs HD_OFFB from self-timing circuit 72A and power ready signal PWR_RDY. Inverter 142 is used to generate delayed, inverse version of signal PS to make the output of XNOR 140 high to set the latch 136.

As illustrated, putting aside the level shifting function and optional use of the PWR_RDY signal, the core function of the transition detector 62A is implemented by the XNOR gate 140, which operates on the signal PS and a delayed version of PS (from delay element 142). The XNOR gate 140 operates to provide an output signal that is logical high for the period of delay (set by delay element 142) each time signal PS transitions, either from logical low to logical high or from logical high to logical low. The output of XNOR gate 140 is otherwise low. The transition detector 62A, therefore, provides an output pulse each time the power switch control signal transitions.

As described above, the VDDM_ext header switches 108 are responsive to signal ON_GM and the VDD_ext header switches 112 are responsive to signal ON_GD. Power switch control circuit 100 includes logic for generating these signals responsive to switch control signal PS and transition detect signal PTD. Specifically, a delayed version (PSD) of switch control signal PS is provided through delay inverter 142 and delay inverter 144. The delay of inverter 142 should be long enough to make sure that the state of the latch 136 is set correctly, and the delay of inverter 144 should be longer than the propagation delay from the output of inverter 142 to node PTD. Signal PSD is inverted using inverter 146 and provided to NOR gate, which also has as an input transition detect signal PTD. The output of NOR gate 148 is provided to inverters 150, 152 to provide signal ON_GM. With respect to signal ON_GD, signal PTD and PSD are provided as inputs to NOR gate 154. The output of NOR gate 154 is passed through inverters 156 and 158 to provide signal ON_GD.

As can be seen from the timing diagram of FIG. 7, signal PS is initial high (logical 1), which means that header VDDM_ext is currently selected and VDD_ext is not selected. At time t1, PS transitions low, which indicates a deselection of VDDM_ext and a selection of VDD_ext. This transition is detected and results in transition detection signal PTD going high at time t2. This transition causes signal GDME to go low at time t3, which turns on the auxiliary VDDM_ext header switch 71. This transitions also results in signal GDMI going logical high at time t4, which turns off switch 124, and also causes ON_GM to go low at time t5. Signal ON_GM low causes the VDDM_ext header switches 108a to 108n to turn off in sequence. When the slowest or last of the VDDM_ext header switches 108n turns off, the self-timing circuit 72A drives HD_OFFB low at time t6. The transition of HD_OFFB low causes transition detection signal PTD to toggle low at time t7. When PTD goes low, signal GDME goes high at time t8. The combination of PTD low and GDME high causes GDDI to go low at time t9. The transition in PTD also causes ON_GD to go high at time t10. With ON_GD high, signal GDD is low, which causes the VDD_ext header switches 112 to start turning on in sequence, from the first VDD_ext header switch 112a to the last (slowest) VDD_ext header switch 112n. It should be noted that as described above in connection with FIG. 3, the timing control circuit 100 operates to delay turning on the selected VDD_ext header switches 112 until the last of the VDDM_ext header switches 108 is off. With ON_GD high, HD_OFFB transitions back high at time t11.

Still with references to FIG. 7, at time t12 after some delay during, switch control signal PS goes high, which means that VDDM_ext is being selected and VDD_ext is being deselected. This transition is detected and results in transition detection signal PTD going high at time t13 for a period of time. This transition causes signal GDDE to go low at time t14, which turns on the auxiliary VDD_ext header switch 73. This transitions also results in signal GDDI going logical high at time t15, which turns off switch 126, and also causes ON_GD to go low at time t16. Signal ON_GD low causes the VDD_ext header switches 112a to 112n to turn off in sequence. When the slowest or last of the VDD_ext header switches 112n turns off, the self-timing circuit 72A drives HD_OFFB low at time t17. The transition of HD_OFFB low causes transition detection signal PTD to toggle low at time t18. When PTD goes low, signal GDDE goes high at time t19. The combination of PTD low and GDDE high causes GDMI to go low at time t20. The transition in PTD also causes ON_GM to go high at time t21. With ON_GM high, signal GDM is low, which causes the VDDM_ext header switches 108 to start turning on in sequence, from the first VDDM_ext header switch 108a to the last (slowest) VDD_ext header switch 108*n*. It should be noted that as described above in connection with FIG. 3, the timing control circuit 100 operates to delay turning on the selected VDDM_ext header switches 108 until the last of the VDD_ext header switches 112 is off. With ON_GM high, HD_OFFB transitions back high at time t22.

In certain embodiments described herein, for example in connection with FIGS. 3 and 6A to 6D, a power switch control scheme prevents power shorts between VDD_ext and VDDM_ext using a transition detector to check if the power switch control signal is toggling. The main power switch is turned off during toggling. The auxiliary header is turned on to prevent floating on the internal supply rail. A self-time delay technique is used to make sure that no power short occurs. And a power detector prevents power shorts during power on/off. In embodiments, a filter is used to filter out signal glitches in the power switch control signal.

Figure 8A:
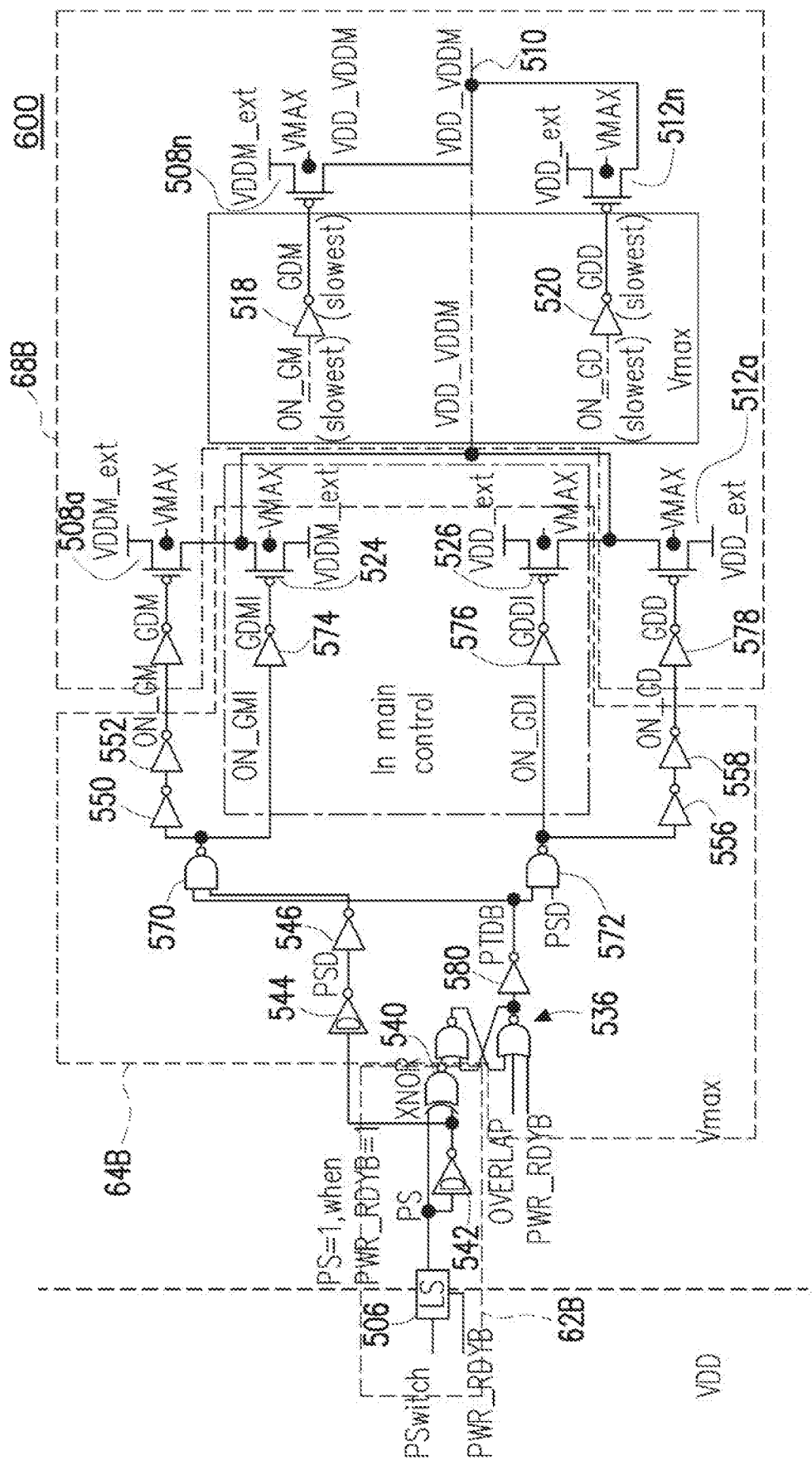
FIGS. 8A to 8C illustrate a power switch control circuit for use in an overlap power supply environment, according to certain embodiments.
Figure 8B:
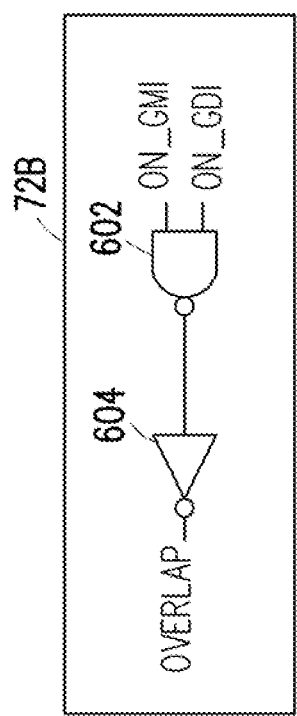
Figure 8C:
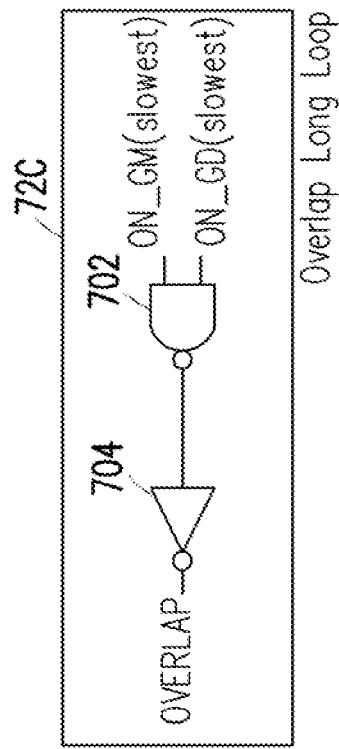
Figure 9:
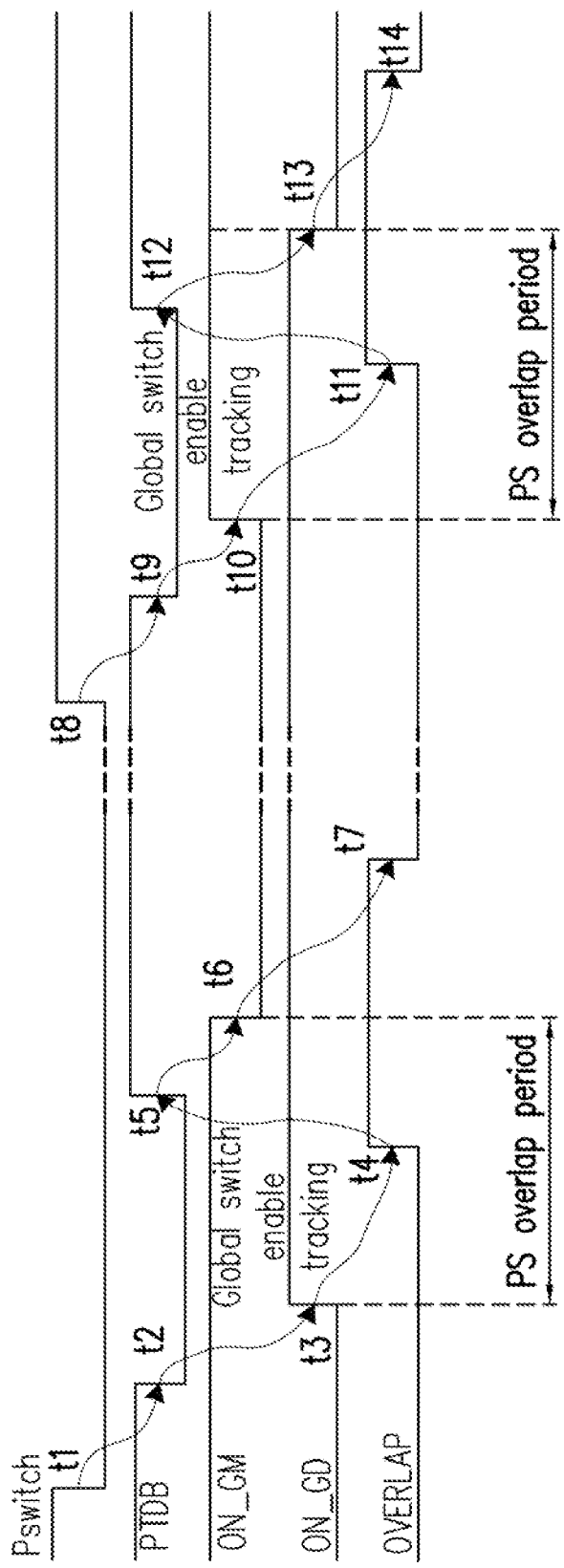
FIG. 9 illustrates a signal timing diagram for the power switch control circuit of FIGS. 8A to 8C, according to certain embodiments.

In certain embodiments, the power switch control sequences of FIG. 4 is implemented in the circuits of FIG. 8A, FIG. 8B, and FIG. 8C. FIG. 9 shows a signal timing diagram illustrating the operation of the circuits of FIGS. 8A to 9D. As described above, the methodology of FIG. 4 is used in the no-floating power domain scenario, where VDD_ext is the same as VDDM_ext or the two power supplies are sufficiently the same such that it is acceptable for there to be a short between the two power supplies when switching from one to the other. One difference between the methodology of FIG. 4 and FIG. 3 is that after the auxiliary header is turned on, the selected main header switches are turned on (step 508 of FIG. 4) followed by then turning off the deselected main header switches (step 514 of FIG. 4) after feedback from the self-timing circuit (step 510 from FIG. 4), whereas in the methodology of FIG. 3 the deselected main header switches are first turned off (step 408 of FIG. 3) followed by then turning on the selected main header switches (step 414 of FIG. 3) after feedback from the self-timing circuit (step 410 of FIG. 3).

FIG. 8A shows a power switch control circuit 600. Devices to the left of the dashed line are in the internal VDD domain and are used to generate signal PS from signal P Switch and signal PWR_RDYB. In embodiments, signal PWR_RDY and its inverse PWR_RDYB are provided by a power detector 200 described above in connection with FIG. 6B, which detects when VDD_ext exceeds the reference voltage (e.g., 2*Vt as explained above in connection with FIG. 5). In FIG. 8A, dashed block 62B illustrates components that correspond to an embodiment of the transition detector 62 of the block diagram of FIG. 2. Transition detector 62B operates in the manner discussed above in connection with transition detector 62A. Dashed block 64B illustrates components that correspond to an embodiment of the control 64 of the block diagram of FIG. 2. In embodiments, the optional power detector of FIG. 6B can be part of the control 64. Dashed block 68B illustrates components that correspond to an embodiment of the main header 68 of the power switch 66 of the block diagram of FIG. 2. The remaining components of FIG. 8A can be considered an embodiment of the control 64 of the block diagram of FIG. 2, along with or in addition to the optional power detector of FIG. 6B.

In many respects, the power switch control circuit 600 is identical to the power switch control circuit 100 described above, and like reference numbers are used to refer to like components. For example, VDDM_ext header switches in FIG. 8A are labeled 508*a* to 508*n*, whereas these VDDM_ext header switches are labeled 108*a* to 108*n* in FIG. 6A. Likewise, VDD_ext header switches in FIG. 8A are labeled 512*a* to 512*n*, whereas these VDD_ext header switches are labeled 112*a* to 112*n* in FIG. 6A. FIG. 8A will only be described below with respect to the relevant difference between the operation of FIGS. 6A and 8A, i.e., with respective to the differences between the methodologies of FIGS. 3 and 4.

One significant difference between the power switch control circuit 600 of FIG. 8A and the power switch control circuit 100 of FIG. 6A is that the circuit 600 of FIG. 8A uses NAND gates 570 in place of NOR gate 148 and NAND gate 572 in place of NOR gate 154. NAND gate 570 has as inputs an inverted version of PSD and an inverted version of PTD (i.e., PTDB). NAND 572 has an inputs PSD and PTDB. This change ensures that the selected header switches (all or some portion thereof) are turned on before the deselected header switches are turned off. Also, the outputs of NAND 570 and NAND 572 provide signals ON_GMI and ON_GDI to inverters 574 and 576, respectively, which provide control signals GDMI and GDDI to VDDM_ext header switch 524 and VDD_ext header switch 526, respectively. The header switches 524, 526 are auxiliary header switches that, in the illustrated embodiment, are included in the main control region (CNT in FIG. 1A) of the macro. With reference to the generation of signal PTDB, as with the latch 136, a first one of the NOR gates of the latch 536 has as an input coupled to the output of an XNOR 540. Unlike latch 136, the second one of the NOR gates of latch 536 has as inputs a signal designated OVERLAP and signal PWR_RDYB. Signal PWR_RDYB is described above in connection with FIG. 6B. Signal OVERLAP is generated using the circuit 72B of FIG. 8B. The circuit 72B includes a NAND gate 602 coupled to an inverter 604. The NAND gate has inputs of ON_GMI and ON_GDI. This embodiment uses a delay of about 4 gate delays (e.g., through NAND 602, inverter 604, latch 536 and inverter 580) before triggering signal OVERLAP, which should be sufficient for about half of the selected header switches to turn on. In certain embodiments, signal OVERLAP could be generated using the circuit 72C of FIG. 8C, which represents the most conservative approach to the timing of the methodology of FIG. 5. The circuit 72C includes NAND gate 702 and inverter 704. In this embodiment, the signals ON_GM and ON_GD are used to time signal OVERLAP with respect to the last of the selected header switches to turn on. Circuits 72B, 72C of FIGS. 8B and 8C, respectively, illustrated embodiments of feedback control 72 in the block diagram of FIG. 2.

The operation of the circuits of FIG. 8A is described below in connection with the timing diagram of FIG. 9. As can be seen from the timing diagram of FIG. 9, signal PS is initially high (logical 1), which means that header VDDM_ext is currently selected and VDD_ext is not selected. At time t1, PS transitions low, which indicates a deselection of VDDM_ext and a selection of VDD_ext. This transition is detected and results in transition detection signal PTDB going low at time t2. This transition causes signal ON_GD to go high at time t3, which causes GDD to go low. With GDD low, the selected VDD_ext header switches 512 begin to turn on, beginning with header switch 512*a* and ending with header switch 512*n*. Signal ON_GM remains high, meaning signal GDM is low and the deselected VDDM_ext header switches 508 remain on. Both the VDDM_ext header switches 508 and the VDD_ext header switches 512 are on for the period that is time t3 to time t6, when ON_GM goes low. However, there are no concerns with shorts between these power supplies in this scenario, because VDD_ext and VDDM_ext are the same or substantially the same. At time t4, after some delay signal OVER- LAP goes high. The time is sufficient to ensure that there is no power floating during external power supply switching. That is, the time is sufficient to allow for a sufficient number of the selected power supply header switches to turn on to ensure operational power on the internal supply line as described above. This triggers PTDB to toggle high at time t5. With PTDB high, signal ON_GM goes low at time t6, which turns off the deselected VDDM_ext header switches 508. Signal OVERLAP goes low at time t7 when ON_GM (assuming the embodiment of FIG. 8C) or ON_GMI (assuming the embodiment of FIG. 8B goes low.

Still with references to FIG. 9, at time t8 after some delay, switch control signal PS goes high, which means that VDDM_ext is being selected and VDD_ext is being deselected. This transition is detected and results in transition detection signal PTDB going low at time t9. This transition causes signal ON_GM to go high at time t10, which causes GDM to go low. With GDM low, the selected VDDM_ext header switches 508 begin to turn on, beginning with header switch 508a and ending with header switch 508n. Signal ON_GD remains high, meaning signal GDD is low and the deselected VDD_ext header switches 512 remain on. Both the VDDM_ext header switches 508 and the VDD_ext header switches 512 are on for the period from time t10 to time t13, when ON_GD goes high. Again, there are no concerns with shorts between these power supplies in this scenario. At time t11, after some delay signal OVERLAP goes high. This triggers PTDB to toggle high at time t12. With PTDB high, signal ON_GD goes low at time t13, which turns off the deselected VDD_ext header switches 512. Signal OVERLAP goes low at time t14 when ON_GD (assuming the embodiment of FIG. 8C) or ON_GDI (assuming the embodiment of FIG. 8B) goes low.

FIG. 10 illustrates an embodiment 60A of the optional filter 60 of the block diagram of FIG. 2. This filter 60A may be used to perform the filter operation 402 of FIG. 3 or filter operation 502 of FIG. 4 described above, in order to filter signal "PSwitch" into signal "Effective PS" in those figures. With respect to the circuits of FIGS. 6A and 8A, the filter 60A can be connected to the input (i.e., to the input of inverter 102 in FIG. 6A or the level shifter 506 of FIG. 8A) such that the signal Effective PS is input (rather than signal PSwitch in those embodiments) based on signal PSwitch. The filter 60A includes a low pass filter 802, specifically a RC low pass filer. Essentially, the filter includes cascaded NMOS transistors and MOS capacitors that operate on the rising and falling edges of the signal. The effective signal will be propagated to the output by the filter if the pulse width is wide enough. In embodiments, the low pass filter has an upper portion 802a coupled to input signal PSwitch through inverter 804 and a lower portion 802b coupled to input signal PSwitch through inverters 806 and 808. The output of the upper portion 802a is coupled as an input to NAND gate 810 along with the output of inverter 804 (i.e., inverted signal PSwitch). The output of NAND gate 810 controls PMOS switch 814. The output of the lower portion 802b is coupled as an input to NOR gate 812 through inverter 836 along with the output of inverter 806 (i.e., inverted signal PSwitch). The output of NOR gate 812 controls NMOS switch 816. The drain terminals of transistor switches 814, 816 are coupled to the output node, where signal Effective PS is provided, through a latch 818.

The upper portion 802a of the low pass filter 802 includes a first stack of transistors 820 having gates coupled to the output of inverter 804 and a second stack of transistors 824 having gates coupled to the output of the first stack 820. It should be understood that stacks 820 and 824 are arranged in an inverter configuration, with the trigger points controlled by the size of the transistors and the ratio of PMOS to NMOS transistors in the stack. In the illustrated embodiment, NMOS transistors M0, M1, M2 and M3 have lengths that are greater than the other transistors in the stacks. Transistors M10 and M11 are arrange as MOS capacitors coupled to the illustrated nodes. The lower portion 802b of the low pass filter is arranged in a similar manner as the upper portion 802a and includes transistors stacks 828 and 832 and MOS capacitors 830 and 834. Transistors M4, M5, M6 and M7 have lengths that are greater than the other transistors in the stacks.

Various embodiments of power switch control schemes are described herein that provide effective control to ensure the quality and reliability of the power switch for use in different applications. In certain embodiments, a transition detector prevents a power short from occurring during power rail change. In certain embodiments, the power short is permitted for an overlap period to make sure sufficient power is supplied for doing operations (such as memory access operations) during power switching. In embodiments, an auxiliary header is used to support potential leakage during power switching for non-overlapping scenarios. In embodiments, the auxiliary header provides power supply for the main controls during power switching for the no-floating scenario. In certain embodiments, a power detector is used to prevent shorting between power supplies during powering on/off of the device. In certain embodiments, a filter is used to filter out unintended glitches in the switch control signal to enable identification of a valid switch control signal transition.

In an embodiment, an electronic device includes an internal supply rail; a plurality of first main header switches for coupling the internal supply rail to a first power supply, the first main header switches being positioned to be sequentially triggered in response to a switch control signal; a plurality of second main header switches for coupling the internal supply rail to a second power supply, the second main header switches being positioned to be sequentially triggered in response to the switch control signal; an auxiliary circuit comprising a first auxiliary header switch for coupling the internal supply rail to the first power supply and a second auxiliary header switch for coupling the internal supply rail to the second power supply; a feedback circuit, the feedback circuit tracking a status of the first and second main header switches; and a control circuit, the control circuit controlling the first main header switches, second main header switches and first and second auxiliary header switches responsive to the switch control signal and an output of the feedback circuit. In an embodiment of the electronic device, the control circuit is configured to turn on one of the first and second auxiliary header switches corresponding to a deselected power supply upon detection of a transition in the switch control signal. In an embodiment, the first and second power supplies have different values, and upon detection of the transition in the switch control signal, the control circuit is configured to delay turning on the main header switches corresponding to a selected power supply until all of the main header switches corresponding to the deselected power supply are turned off. In an embodiment, the feedback circuit is configured to indicate when all of the main header switches corresponding to the deselected power supply are turned off, and the control circuit is further configured to turn off the one of the auxiliary header switches in response to the feedback circuit. In an embodiment, the first and second power supplies have substantially the same values, and upon detection of the transition in the switch control signal, the control circuit is configured to delay turning off the main header switches corresponding to the deselected power supply until a selected number of the main header switches corresponding to a selected power supply are turned on. In an embodiment, the feedback circuit is configured to indicate when a last one of the main header switches corresponding to the selected power supply is turned on. In an embodiment, the feedback circuit is configured to indicate when an intermediate one, between a first and last one, of the main header switches corresponding to the selected power supply is turned on. In an embodiment, the control circuit is further configured to turn off the one of the auxiliary header switches and turn off the main header switches corresponding to a deselected power supply in response to the feedback circuit. In an embodiment, the electronic device further includes a memory array coupled to the internal supply rail, wherein the delay turning off the main header switches corresponding to the deselected power supply is selected such that there is sufficient power on the internal supply rail to allow for access operations to the memory array during power switching. In an embodiment, the electronic device further includes a memory array coupled to the internal supply rail. In an embodiment, the control circuit is coupled to a second power rail different from the internal supply rail, the second power rail being tied to a greater of the first and second power supplies. In an embodiment, the electronic device further includes a level shifter, the level shifter shifting the switch control signal from an internal power domain to a power domain of the control circuit. In an embodiment, the electronic device further includes a filter for filtering the switch control signal to filter out glitches on the switch control signal, thereby preventing unintended power switching. In an embodiment, the electronic device further includes a power detector for detecting when the first power supply is above a reference voltage, wherein the control circuit is configured to turn off the first main header switches and turn on the second main header switches when the first power supply is below the reference voltage, and wherein the control circuit is configured to control the first and second main header switches in accordance with the switch control signal when the first power supply is above the reference voltage. In an embodiment, the control circuit controls the first and second main header switches to prevent shorts between the first and second power supplies through the internal supply rail during switching between the first power supply and the second power supply.

In an embodiment, a method of power supply switching for an electronic device includes the steps of receiving a power switch control signal indicating selection of a power supply from first and second power supplies to be connected to an internal supply rail; turning on an auxiliary header switch corresponding to a deselected power supply upon detection of a transition in the switch control signal; and after turning on the auxiliary header switch, controlling first main header switches and second main header switches responsive to the switch control signal and feedback regarding the status the first and second main header switches. In an embodiment, the first and second power supplies have different values, and the controlling step includes upon detection of the transition in the switch control signal, (i) turning off the main header switches corresponding to the deselected power supply and (ii) turning on the main header switches corresponding to a selected power supply after all of the main header switches corresponding to the deselected power supply are turned off. In an embodiment, the first and second power supplies have substantially the same values, and the controlling step includes upon detection of the transition in the switch control signal, (i) turning on the main header switches corresponding to a selected power supply and (ii) delay turning off the main header switches corresponding to the deselected power supply until a selected number of the main header switches corresponding to the selected power supply are turned on. In an embodiment, the delay is (i) until a last one of the main header switches corresponding to the selected power supply is turned on or (ii) until an intermediate one, between a first and last one, of the main header switches corresponding to the selected power supply is turned on.

In an embodiment of a memory device, the memory device includes a memory array coupled to an internal supply rail; a main power switch including (i) a plurality of first main header switches for coupling the internal supply rail to a first power supply, the first main header switches being positioned along the memory array to be sequentially triggered in response to a switch control signal and (ii) a plurality of second main header switches for coupling the internal supply rail to a second power supply, the second main header switches being positioned along the memory array to be sequentially triggered in response to the switch control signal; an auxiliary circuit comprising a first auxiliary header switch for coupling the internal supply rail to the first power supply and a second auxiliary header switch for coupling the internal supply rail to the second power supply; a feedback circuit, the feedback circuit tracking a status of the first and second main header switches; a power detector for detecting when the first power supply is above a reference voltage; and a control circuit, the control circuit controlling the first main header switches, second main header switches and first and second auxiliary header switches, the control circuit being configured to turn off the first main header switches and turn on the second main header switches when the first power supply is below the reference voltage and configured to control the first and second main header switches and auxiliary switches in accordance with the switch control signal and an output of the feedback circuit when the first power supply is above the reference voltage. In an embodiment, the control circuit is coupled to a second power rail different from the internal supply rail, the second power rail being tied to a greater of the first and second power supplies; and the memory device further includes a level shifter, the level shifter shifting the switch control signal from an internal power domain to a power domain of the control circuit. In an embodiment, the control circuit controls the first and second main header switches to prevent shorts between the first and second power supplies through the internal supply rail during switching between the first power supply and the second power supply. In an embodiment, the first and second power supplies are substantially the same, and the control circuit controls the first and second main header switches such that there is sufficient power on the internal supply rail to allow for access operations to the memory array during switching between the first and second power supplies.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array coupled to an internal supply rail;
   a plurality of first main header switches for coupling the internal supply rail to a first power supply, the first main header switches being positioned to be sequentially triggered in response to a switch control signal;
   a plurality of second main header switches for coupling the internal supply rail to a second power supply, the second main header switches being positioned to be sequentially triggered in response to the switch control signal;
   an auxiliary circuit comprising a first auxiliary header switch for coupling the internal supply rail to the first power supply and a second auxiliary header switch for coupling the internal supply rail to the second power supply;
   a feedback circuit, the feedback circuit tracking a status of the first and second main header switches; and
   a control circuit, the control circuit controlling the first main header switches, second main header switches and first and second auxiliary header switches responsive to the switch control signal and an output of the feedback circuit.

2. The memory device of claim 1, wherein the control circuit is configured to turn on one of the first and second auxiliary header switches corresponding to a deselected power supply upon detection of a transition in the switch control signal.

3. The memory device of claim 2,
   wherein the first and second power supplies have different values,
   wherein upon detection of the transition in the switch control signal, the control circuit is configured to delay turning on the main header switches corresponding to a selected power supply until all of the main header switches corresponding to the deselected power supply are turned off.

4. The memory device of claim 3, wherein the feedback circuit is configured to indicate when all of the main header switches corresponding to the deselected power supply are turned off, and wherein the control circuit is further configured to turn off the one of the auxiliary header switches in response to the feedback circuit.

5. The memory device of claim 2, further comprising a transition detector coupled to the control circuit, the transition detector detecting transitions in the switch control signal.

6. The memory device of claim 5, further comprising a filter having an output coupled to an input to the transition detector for filtering the switch control signal.

7. The memory device of claim 1, wherein the memory array is static random access memory (SRAM) array.

8. The memory of claim 1, wherein the first main header switches and second main header switches are positioned along the periphery of the memory array.

9. The memory device of claim 8, wherein the feedback circuit is located proximate to a last one of the first main header switches and second main header switches to be triggered in response to the switch control signal.

10. A method of power supply switching for a memory device comprising the steps of:
    receiving a power switch control signal indicating selection of a power supply from first and second power supplies to be connected to an internal supply rail, wherein the first and second power supplies have different values;
    turning on an auxiliary header switch corresponding to a deselected power supply upon detection of a transition in the power switch control signal; and
    after turning on the auxiliary header switch:
       turning off the main header switches corresponding to the deselected power supply; and
       turning on the main header switches corresponding to a selected power supply after all of the main header switches corresponding to the deselected power supply are turned off.

11. The method of claim 10, further comprising, turning off the auxiliary header switch after all of the main header switches corresponding to the deselected power supply are turned off.

12. The method of claim 11, wherein turning off the auxiliary header switch after all of the main header switches is performed before turning on the main header switches corresponding to the selected power supply.

13. The method of claim 10, wherein the memory devices is a static random access memory (SRAM) device.

14. The method of claim 10, further comprising receiving the power switch control signal and filtering the power switch control signal, wherein turning on the auxiliary header switch corresponding to the deselected power supply is performed upon detection of a transition in the filtered power switch control signal.

15. A method of power supply switching for a memory device comprising the steps of:
    receiving a power switch control signal indicating selection of a power supply from first and second power supplies to be connected to an internal supply rail, wherein the first and second power supplies have substantially the same values;
    turning on an auxiliary header switch corresponding to a deselected power supply upon detection of a transition in the power switch control signal; and
    after turning on the auxiliary header switch:
       turning on the main header switches corresponding to a selected power supply; and
       turning off the main header switches corresponding to the deselected power supply after a selected number of the main header switches corresponding to the selected power supply are turned on.

16. The method of claim 15, further comprising turning off the auxiliary header switch corresponding to the deselected power supply after the selected number of the main header switches corresponding to the selected power supply are turned on.

17. The method of claim 15, wherein the memory devices is a static random access memory (SRAM) device.

18. The method of claim 15, further comprising receiving the power switch control signal and filtering the power switch control signal, wherein turning on the auxiliary header switch corresponding to the deselected power supply is performed upon detection of a transition in the filtered power switch control signal.

19. The method of claim 15, wherein turning off the main header switches corresponding to the deselected power supply after a selected number of the main header switches corresponding to the selected power supply are turned on comprises delaying until a last one of the main header switches corresponding to the selected power supply is turned on.

20. The method of claim 15, wherein turning off the main header switches corresponding to the deselected power supply after a selected number of the main header switches corresponding to the selected power supply are turned on comprises delaying until an intermediate one, between a first and last one, of the main header switches corresponding to the selected power supply is turned on.

\* \* \* \* \*